United States Patent [19]

Okishi

[11] 4,348,954

[45] * Sep. 14, 1982

[54] AGENT FOR PROTECTING THE SURFACE OF LITHOGRAPHIC PRINTING PLATE

[75] Inventor: Yoshio Okishi, Shizuoka, Japan

[73] Assignee: Fuji Photo Film Co., Ltd., Kanagawa, Japan

[ * ] Notice: The portion of the term of this patent subsequent to Mar. 3, 1998, has been disclaimed.

[21] Appl. No.: 213,525

[22] Filed: Dec. 5, 1980

Related U.S. Application Data

[63] Continuation of Ser. No. 51,300, Jun. 22, 1979, abandoned.

[30] Foreign Application Priority Data

Jun. 23, 1978 [JP] Japan ........................ 53-76164
Nov. 29, 1978 [JP] Japan ........................ 53-148519

[51] Int. Cl.[3] ........................ G03F 7/02

[52] U.S. Cl. ........................ 101/465; 101/464; 106/2; 106/17 R; 106/17.4 ST; 524/375; 524/166

[58] Field of Search ........................ 101/456, 457, 464, 465; 106/2, 5, 6, 8, 10, 11, 14.5; 260/29.6 Z, 17 R, 17.4 ST

[56] References Cited

U.S. PATENT DOCUMENTS

| | | | |
|---|---|---|---|
| 3,525,704 | 8/1970 | Stimson et al. | 260/29.6 Z |
| 3,679,479 | 7/1972 | Ray et al. | 101/466 |
| 4,162,920 | 7/1979 | Gillich | 106/14.5 |
| 4,253,999 | 3/1981 | Okishi | 101/465 |
| 4,258,122 | 3/1981 | Uchida | 101/456 |

*Primary Examiner*—V. P. Hoke
*Attorney, Agent, or Firm*—Sughrue, Mion, Zinn, Macpeak & Seas

[57] ABSTRACT

An emulsion type protective agent for the surface of a lithographic printing plate comprising an aqueous phase having dissolved therein a hydrophilic high molecular weight compound and an oil phase containing an organic solvent, an alkylphenyl type nonionic surfactant having an HLB less than 14 and an anionic surfactant.

44 Claims, No Drawings

AGENT FOR PROTECTING THE SURFACE OF LITHOGRAPHIC PRINTING PLATE

This is a continuation of application Ser. No. 051,300, filed June 22, 1979, now abandoned.

BACKGROUND OF THE INVENTION

1. Field of the Invention

This invention relates to an agent for protecting the surface of a lithographic printing plate, especially to an emulsion type plate protective agent.

2. Description of the Prior Art

The final step of the process of making a lithographic printing plate is generally referred to as a gumming step since in this step the plate is coated with a gumming solution to protect the non-image areas (which retain water and repel greasy printing ink). While the primary purpose of gumming is to desensitize or increase the hydrophilicity of the non-image area of the lithographic printing plate it has other purposes. Namely, to prevent possible deterioration of the lithographic printing plate during the period between making the plate and printing or during the period when printing is interrupted; to prevent the non-image area from becoming receptive to printing ink due to sebum on fingers and other foreign matter during handling of the lithographic printing plate such as when it is set on a printing machine; and to prevent development of scratches and other flaws on the non-image area or image-area (which repels water and accepts printing ink) during handling of the plate.

Among conventional gumming solutions, the most effective is an emulsion type gumming solution which comprises an oil phase having dissolved in an organic solvent a lipophilic substance soluble in the solvent plus an emulsifying surfactant and an aqueous phase having water soluble dextrin dissolved therein. When this type of gumming solution is used to gum a plate for lithographic printing, the image area is protected by the lipophilic substance in the oil phase whereas the non-image area is protected by the water soluble dextrin in the aqueous phase. As a result, the lipophilicity of the image area decreases only slightly even if it is in contact with the water soluble dextrin.

However, this emulsion type gumming solution is still unable to prevent a decrease in the lipophilicity of the image area completely.

SUMMARY OF THE INVENTION

It is therefore a primary object of this invention to provide a protective agent for a lithographic printing plate which does not reduce the lipophilicity of the image area of the plate.

As a result of various studies directed to an emulsion type gumming solution to achieve the above object, the inventors of this invention have unexpectedly found that this object can be accomplished by incorporating an alkylphenyl type nonionic surfactant having an HLB (hydrophile-lipophile balance) less than 14 and an anionic surfactant in the oil phase of a conventional emulsion type gumming solution. Accordingly this invention provides an emulsion type protective agent for the surface of a lithographic printing plate comprising an aqueous phase having dissolved therein a hydrophilic high molecular weight compound and an oil phase containing an organic solvent, an alkyl phenyl type nonionic surfactant having an HLB less than 14 and an anionic surfactant.

DETAILED DESCRIPTION OF THE INVENTION

The alkylphenyl type nonionic surfactant having an HLB less than 14 and an anionic surfactant in the oil phase which characterizes this invention will hereunder be described in detail.

The alkylphenyl type nonionic surfactant having an HLB less than 14 is preferably a compound which is represented by the following formula (I) and has an HLB less than 14:

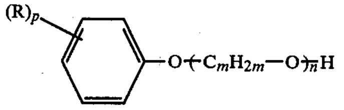

(I)

wherein R is an alkyl group; p is 1 or 2; m is an integer of 1 to 4; and n is an integer of 2 or more.

The alkyl group R preferably has 8 to 18 carbon atoms and is a straight chain alkyl group although a branched chain alkyl group is useful, such as an octyl group, a nonyl group, a decyl group, an undecyl group, a dodecyl group (lauryl group), a tetradecyl group and a hexadecyl group (cetyl group). The most preferred alkyl groups are an octyl group and a nonyl group. While R is generally in the para position with respect to the $-O-(C_mH_{2m}-O)_nH$ group, it may be in the meta or ortho position. A preferred number for p is 1 and for m is 2. While n represents different numbers according to the nature of the alkyl group R, it is within such a range that the value of HLB is less than 14, and preferably it is in the range of from 4 to 12, most preferably 7 to 12.

A protective agent containing an alkylphenyl nonionic surfactant having an HLB larger than 14 is not desirable because it reduces the lipophilicity of the image area of a lithographic printing plate.

Specific examples of the alkylphenyl type nonionic surfactant having an HLB less than 14 include polyoxymethylene octylphenyl ether, polyoxymethylene nonylphenyl ether, polyoxymethylene cetylphenyl ether, polyoxymethylene laurylphenyl ether, polyoxyethylene octylphenyl ether, polyoxyethylene nonylphenyl ether, polyoxyethylene decylphenyl ether, polyoxyethylene laurylphenyl ether, polyoxypropylene octylphenyl ether, polyoxypropylene nonylphenyl ether, polyoxypropylene decylphenyl ether, polyoxypropylene laurylphenyl ether, polyoxypropylene cetylphenyl ether, polyoxybutylene octylphenyl ether, polyoxybutylene nonylphenyl ether, polyoxybutylene decylphenyl ether, polyoxybutylene laurylphenyl ether, polyoxybutylene cetylphenyl ether, and polyoxyethylene dinonylphenyl ether, all these examples having an HLB less than 14. Particulary advantageous for the purpose of this invention are those of the polyoxyethylene type such as polyoxyethylene nonylphenyl ether and polyoxyethylene octylphenyl ether.

The anionic surfactant used in the present invention is exemplified by aliphatic acid salts (preferably salts of an acid having 8 to 22 carbon atoms), salts of alkylsulfate esters (preferably salts of straight chain or branched chain alkyl esters having 8 to 18 carbon atoms), alkylbenzenesulfonates (in which the alkyl moiety is a straight chain or branched chain and preferably has 8 to 18 carbon atoms), alkylnaphthylenesulfonates (in which the alkyl moiety is straight chain or branched and preferably has 3 to 10 carbon atoms), salts of dialkylsulfosuccinate esters (in which the alkyl group is straight chain or branched chain and has 2 to 18 carbon atoms such as a sec-butyl group, a tert-butyl group, a hexyl group, a 2-ethylhexyl group, a nonyl group, a decyl group, and a dodecyl group), salts of alkyl phosphate esters (in which the alkyl moiety is straight chain or branched chain and preferably has 8 to 18 carbon atoms), condensates of naphthylenesulfonic acid with formalin and salts of polyoxyethylene alkyl sulfate esters (preferably having up to 6 polyoxyethylene units and a straight chain or branched alkyl moiety having 8 to 18 carbon atoms). The most preferred anionic surfactant is a salt of a dialkylsulfosuccinate. Specific examples of the salt of dialkylsulfosuccinate are sodium di(2-ethylhexyl)sulfosuccinate, sodium dinonylsulfosuccinate and sodium dilaurylsulfosuccinate.

A plate protective agent containing a combination of the alkylphenyl type nonionic surfactant and anionic surfactant defined above does not decrease the lipophilicity of an image area as much as a plate protective agent containing either type of surfactant alone. The sum of the amounts of the two types of surfactant to be used in this invention is in the range of from about 0.5 to about 10 wt%, preferably from 1 to 5 wt%, based on the total weight of the plate protective agent. A suitable proportion of the alkylphenyl type nonionic surfactant to anionic surfactant is within the range of from about 10:1 to 1:10, preferably from about 5:1 to 1:5, by weight.

The above defined two types of surfactant are dissolved in an organic solvent to make the oil phase of the plate protective agent of this invention. A preferred organic solvent is insoluble in water, such as a hydrocarbon typified by turpentine oil, xylene, toluene, n-heptane, solvent naphtha, kerosine, mineral spirit, a petroleum fraction at a boiling point of from about 120° to about 250° C.; a plasticizer which solidifies at less than 15° C. and boils at more than 300° C. at one atmosphere such as a phthalic acid diester typified by dibutyl phthalate, diheptyl pthalate, di-n-octyl phthalate, di(2-ethylhexyl)phthalate, dinonyl phthalate, didecyl phthalate, dilauryl phthalate, and butylbenzyl phthalate, an aliphatic ester of dibasic acids typified by dioctyl adipate, butylglycol adipate, dioctyl azelate, dibutyl sebacate, di(2-ethylhexyl)sebacate, and dioctyl sebacate, an epoxidized triglyceride such as epoxidized soybean oil, a phosphate ester such as tricresyl phosphate, trioctyl phosphate and trischloroethyl phosphate, and a benzoic ester such as benzyl benzoate.

These solvents may be used in combination with an aliphatic ketone such as cyclohexanone, an aliphatic halide such as ethylene dichloride, and an ethylene glycol ether such as ethylene glycol monomethyl ether, ethylene glycol monophenyl ether, or ethylene glycol monobutyl ether.

The solvents are used in an amount within the range of from about 0.1 to about 10 wt%, preferably from 0.5 to 5 wt%, based on the total weight of the plate protective agent.

The oil phase of the protective agent according to this invention preferably contains dissolved therein a lipophilic substance for the purpose of enhancing the stability of the protective agent in emulsified state and minimizing the potential decrease in the lipophilicity of the image area. A preferred lipophilic substance is one of those which are conventionally used as a vehicle for lithographic printing ink. Specific examples of the suitable lipophilic substance include a novolak phenolic resin such as a phenol-formaldehyde resin, cresol-formaldehyde resin or tert-butylphenol-formaldehyde resin; a xylene resin prepared by condensing phenol and xylene with formaldehyde; a resin prepared by condensing phenol and mesitylene with formaldehyde; polyhydroxystyrene; brominated polyhydroxystyrene; cashew resin; partially esterified product of a copolymer of styrene and maleic anhydride; melamine resin; alkyd resin; polyester resin; epoxy resin; rosin or modified rosin such as hydrogenated rosin or rosin ester; and a petroleum resin such as gilsonite. A novolak phenolic resin, rosin or modified rosin are preferred. Other examples of the suitable lipophilic substance include an aliphatic carboxylic acid having 5 to 25 carbon atoms such as oleic acid, lauric acid, valeric acid, nonylic acid, capric acid, myristic acid and palmitic acid, as well as castor oil. Whether used independently or as a mixture, these lipophilic substances are used in an amount within the range of from about 0.05 to about 5 wt%, preferably from 0.1 to 1 wt%, based on the total weight of the plate protective agent.

The hydrophilic high molecular weight compound contained in the aqueous phase of the plate protective agent according to this invention functions to protect the non-image area of a lithographic printing plate and it is preferably composed of a film-forming, water-soluble resin.

Examples of the suitable film-forming, hydrophilic high molecular weight compound are dextrin, gum arabic, an alginate such as sodium alginate, a water soluble cellulose such as carboxymethylcellulose, hydroxyethylcellulose or methylcellulose, polyvinyl alcohol, polyvinyl pyrrolidone, polyacrylamide, a water soluble copolymer containing an acrylamide unit, a copolymer of vinyl methyl ether and maleic anhydride, or a copolymer of vinyl acetate and maleic anhydride. Particularly preferred are gum arabic, dextrin, polyvinyl pyrrolidone, carboxymethylcellulose and polyvinyl alcohol. Gum arabic is most preferred. These film-forming, hydrophilic high molecular weight compounds are used independently or as a mixture. Of special advantage is a gum arabic and dextrin combination which is able to enhance the hydrophilicity of the non-image area without reducing the lipophilicity of the image area. While these hydrophilic high molecular weight compounds may be contained in the aqueous phase in a wide range of concentrations, they are generally used in an amount within the range of from about 5 to about 40 wt%, preferably from 10 to 30 wt%, based on the total weight of the plate protective agent, and their concentration in the aqueous phase is in the range of from about 6 to about 60 wt%, preferably from 15 to 50 wt%.

The aqueous phase of the plate protective agent according to this invention preferably contains a wetting agent for the purpose of allowing the aqueous phase to spread suitably to the non-image area of the lithographic printing. A preferred wetting agent is polyhydric alcohol, which is specifically exemplified by ethylene glycol, diethylene glycol, triethylene glycol, propylene glycol, butylene glycol, pentanediol, hexylene glycol, tetraethylene glycol, polyethylene glycol, dipropylene glycol, tripropylene glycol, glycerin, sorbitol or pentaerythritol. Glycerin is most preferred. These wetting agents are used in an amount of from about 0.5 to about 10 wt%, preferably from 1 to 5 wt%, based on the total weight of the plate protective agent.

The aqueous phase of the plate protective agent according to this invention preferably contains a water soluble salt for the purpose of enhancing the hydrophilicity of the non-image area of a lithographic printing plate when it is coated with the plate protective agent. Advantageous water soluble salts include an alkali metal salt and an ammonium salt; particularly advantageous are water soluble alkali metal salts and ammonium salts of acids such as acetic acid, molybdic acid, boric acid, nitric acid, sulfuric acid, phosphoric acid and polyphosphoric acid. Specific examples are ammonium acetate, sodium acetate, potassium acetate, sodium molybdate, potassium molybdate, sodium borate, ammonium borate, lithium nitrate, sodium nitrate, potassium nitrate, sodium primary phosphate, sodium secondary phosphate, sodium tertiary phosphate, potassium primary phosphate, potassium secondary phosphate, potassium tertiary phosphate, ammonium tertiary phosphate, and sodium polyphosphate. Particularly preferred are potassium acetate, sodium borate, ammonium borate, potassium nitrate, sodium molybdate, potassium molybdate and potassium sulfate. Whether used independently or as a mixture, these water soluble salts are used in an amount of from about 0.05 to about 2 wt%, preferably from 0.1 to 1 wt%, based on the total weight of the plate protective agent.

If gum arabic is used as the hydrophilic high molecular weight compound to be contained as dissolved in the aqueous phase of the plate protective agent, the pH of the aqueous phase is controlled to be acidic, preferably in the range of from 1 to 5, more preferably from 1 to 3. Therefore, if the aqueous phase is not acidic, an acid is used to render it acidic. Acids used for pH adjustment include a mineral acid such as phosphoric acid, sulfuric acid or nitric acid, and an organic acid such as citric acid, tannic acid, malic acid, glacial acetic acid, lactic acid, oxalic acid or p-toluenesulfonic acid. Phosphoric acid is particularly advantageous because it not only functions as an agent to adjust the pH of the aqueous phase but it also prevents staining of the non-image area, and is used in an amount of from 0.1 to 8 wt%, preferably from 0.5 to 5 wt%, based on the total weight of the aqueous phase.

A typical example of the method of preparing the plate protective agent of this invention will hereunder be described.

First, a hydrophilic high molecular weight compound is dissolved in water to form an aqueous phase. If necessary, a wetting agent, a water soluble salt and/or acid is added to the aqueous phase. Separately, a surfactant is dissolved in an organic solvent to form an oil phase. If necessary, a lipophilic substance is added to the oil phase. The oil phase is added dropwise to the aqueous phase under stirring. A homogenizer is used to promote emulsification of the mixture until the protective agent of this invention is prepared.

While the plate protective agent of this invention can be used with a variety of lithographic printing plates, it is applied with advantage to lithographic printing plates prepared by performing imagewise exposure and development of a presensitized lithographic printing plate (hereinafter referred to as PS plate) which comprises an aluminum substrate coated with a photosensitive layer.

PS plates which are of particular advantage to the object of this invention will hereunder be described in detail.

Aluminum plates which are advantageously used as a substrate include a pure aluminum plate and aluminum alloy plate as well as a plastic film laminated or metallized with aluminum. These aluminum plates are preferably subjected to surface treatment such as graining, immersion in an aqueous solution of sodium silicate, potassium fluorozirconate or phosphate, or anodization. Other advantageous substrates are an aluminum plate of the type described in U.S. Pat. No. 2,714,066 which is grained and thereafter immersed in an aqueous solution of sodium silicate, and an aluminum plate of the type described in U.S. Pat. No. 3,181,461 which is anodized before it is immersed in an aqueous solution of an alkali metal silicate. The anodization is carried out using an aluminum anode in an electrolyte comprising one or more aqueous or non-aqueous solutions of an inorganic acid such as phosphoric acid, chromic acid, sulfuric acid or boric acid, or an organic acid such as oxalic acid or sulfamic acid, or salts thereof.

The technique of electrodeposition with silicate as described in U.S. Pat. No. 3,658,662 can also advantageously be employed in this invention.

Another example of the advantageous substrate is an aluminum plate of the type described in U.S. Pat. No. 4,087,341, Japanese Patent Publication No. 27481/71 and Japanese Patent Application (OPI) No. 30503/77 (the term "OPI" as used herein refers to a "published unexamined Japanese patent application") which is first electrograined and then anodized in the manner described above. A further example is an aluminum plate of the type described in U.S. Pat. No. 3,834,998 which is grained, chemically etched and anodized as described above. These surface treatments are applied not only for the purpose of making the surface of the substrate hydrophilic but also for the purposes of preventing any adverse reaction with the photosensitive composition placed on the substrate and providing strong bond between the substrate and photosensitive layer.

Preferred examples of the composition that makes the photosensitive layer to be formed on these aluminum substrates include the following:

(1) Compositions composed of diazo resins

Diazo resins which are typified by a condensate of p-diazodiphenylamine and paraformaldehyde may be water soluble or insoluble, and they are preferably insoluble in water and soluble in conventional organic solvents. Particularly preferred diazo compounds are salts of a condensate of p-diazophenylamine and formaldehyde or acetaldehyde, such as a compound having two or more diazo groups in its molecule in the form of a phenolate, fluorocaprate or salts of sulfonic acids such as triisopropyl naphthalenesulfonic acid, 4,4-biphenyldisulfonic acid, 5-nitro-ortho-toluenesulfonic acid, 5-sulfosalicylic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoylbenzenesulfonic acid and paratoluenesulfonic acid. Other preferred diazo resins include a condensate of 2,5-dimethoxy-4-p-tolylmercaptobenzenediazonium and formaldehyde in the form of the salts illustrated above.

Another preferred example is the diazo resin described in British Pat. No. 1,312,925.

While these diazo resins may individually serve as a photosensitive material to be used for preparing a resist, they are preferably used in combination with a binder.

A variety of polymers can be used as the binder. A preferred binder contains a hydroxy, amino, carboxylic acid, amido, sulfone amide, active methylene, thioalcohol, epoxy and other groups. Examples of such preferred binder are: shellac of the type described in British Pat. No. 1,350,521; a polymer of the type described in British Pat. No. 1,460,978 and U.S. Pat. No. 4,125,276 which contains a hydroxyethyl acrylate or hydroxyethyl methacrylate unit as the predominant repeating unit; a polyamide resin of the type described in U.S. Pat. No. 3,751,257; a phenolic resin and a polyvinyl acetal resin such as polyvinyl formal resin or polyvinyl butyral which are of the type described in British Pat. No. 1,074,392; a linear polyurethane resin, polyvinyl alcohol resin esterified with phthalic acid, an epoxy resin prepared by condensing bisphenol A and epichlorohydrin, a polymer containing an amino group such as polyaminostyrene or polyalkyl amino (meth)acrylate, cellulose such as cellulose acetate, cellulose alkyl ether, cellulose acetate phthalate, which are of the type described in U.S. Pat. No. 3,660,097.

These binders are suitably contained in the photosensitive resist forming composition in an amount of from 40 to 95 wt%. Higher binder content (in other words, lower diazo resin content) of course results in greater sensitivity but this is compromised by low time-dependent stability. Optimum content of the binder is in the range of from about 70 to 90 wt%.

Compositions composed of these diazo resins may optionally contain other additives such as phosphoric acid, dye and pigment as described in U.S. Pat. No. 3,236,646.

(2) Compositions composed of o-quinonediazide compounds

A particularly preferred o-quinonediazide compound is an o-naphthoquinonediazide compound of the type described in U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709; 3,647,443 and many other publications. Particularly preferred are o-napthoquinonediazidosulfonic acid ester or o-naphthoquinonediazidocarboxylic acid ester of aromatic hydroxy compound, and o-naphthoquinonediazidosulfonamide or o-naphthoquinonediazidocarboxylic acid amide of aromatic amino compound. Very effective compounds are a condensate of pyrogallol and acetone esterified with o-naphthoquinonediazidosulfonic acid as described in U.S. Pat. No. 3,635,709; a polyester having a terminal hydroxy group esterified with o-naphthoquinonediazidosulfonic acid or o-naphthoquinonediazidocarboxylic acid as described in U.S. Pat. No. 4,028,111; a homopolymer of p-hydroxystyrene or a copolymer thereof with another copolymerizable monomer which is esterified with o-naphthoquinonediazidosulfonic acid or o-naphthoquinonediazidocarboxylic acid as described in U.S. Pat. No. 4,139,384.

While these o-quinoneazide compounds can be used independently, they are preferably used as a mixture with an alkali-soluble resin. A suitable alkali-soluble resin includes a novolak type phenolic resin such as a phenolformaldehyde resin, o-cresol-formaldehyde resin or m-cresolformaldehyde resin. More preferably, these phenolic resins are used in combination with a tert-butylphenol-formaldehyde resin which is a condensate of formaldehyde and phenol or cresol substituted by an alkyl group having 3 to 8 carbon atoms, as described in U.S. Pat. No. 4,123,279. These alkalisoluble resins are contained in the photosensitive resist forming composition in an amount of from about 50 to 85 wt%, preferably from 60 to 80 wt%, based on the total weight of said composition.

Photosensitive compositions composed of these o-quinonediazide compounds may optionally contain other additives such as pigment, dye and plasticizer.

(3) Compositions composed of photosensitive azide compounds

A suitable photosensitive azide compound is an aromatic azide compound wherein an azido group is bonded to the aromatic ring either directly or through a carbonyl group or sulfonyl group. Upon exposure to light, the azido group of the compound is decomposed to form nitrene which enters into various reactions that insolubilize the compound. A preferred aromatic azide compound is such that it contains one or more groups such as azidophenyl, azidostyryl, azidobenzal, azidobenzoyl and azidocinnamoyl; specific examples are 4,4'-diazidochalcone, 4-azido-4'-(azidobenzoylethoxy)chalcone, N,N-bis-p-azidobenzal-p-phenylenediamine, 1,2,6-tri(4'-azidobenzoxy)hexane, 2-azido-3-chloro-benzoquinone, 2,4-diazido-4'ethoxy-azobenzene, 2,6-di-(4'-azidobenzal)-4-methylcyclohexane, 4,4'-diazidobenzophenone, 2,5-diazido-3,6-dichlorobenzoquinone, 2,5-bis(4-azidostyryl)-1,3,4-oxadiazole, 2-(4-azidocinnamoyl)thiophene, 2,5-di(4'-azidobenzal)cyclohexanone, 4,4'-diazidophenylmethane, 1-(4-azidophenyl)-5-furyl-2-penta-2,4-dien-1-one, 1-(4-azidophenyl)-5-(4-methoxyphenyl)-penta-1,4-dien-3-one, 1-(4-azidophenyl)-3-(1-naphthyl)propen-1-one, 1-(4-azidophenyl)-3-(4-dimethylaminophenyl)propan-1-one, 1-(4-azidophenyl)-5-phenyl-1,4-pentadien-3-one, 1-(4-azidophenyl)-3-(4-nitrophenyl)-2-propen-1-one, 1-(4-azidophenyl)-3-(2-furyl)-2-propen-1-one, 1,2,6-tri(4'-azidobenzoxy)hexane, 2,6-bis-(4-azidobenzylidyne-p-t-butyl)cyclohexanone, 4,4'-diazidodibenzalacetone, 4,4'-diazidostilbene-2,2'-disulfonic acid, 4'-azidobenzalacetophenone-2-sulfonic acid, 4,4'-diazidostilbene-α-carboxylic acid, di-(4-azido-2'-hydroxybenzal)acetone-2-sulfonic acid, 4-azidobenzalacetophenone-2-sulfonic acid, 2-azido-1,4-dibenzenesulfonylaminonaphthalene, or 4,4-diazido-stilbene-2,2'-disulfonic acid anilide.

These low-molecular-weight aromatic diazide compounds may advantageously be replaced by the azido-containing polymer which is illustrated in Japanese Patent Publications Nos. 9047/69; 31837/69; 9613/70; 24915/70; 25713/70; Japanese Patent Application (OPI) Nos. 5102/75; 84302/75; 84303/75; and 12984/78.

The above defined photosensitive azide compounds are preferably used in combination with a polymer which works as a binder. A preferred binder is an alkali-soluble resin. Examples of the alkali-soluble resin include: a natural resin such as shellac or rosin; a novolak type phenolic resin such as phenol-formaldehyde resin or m-cresol-formaldehyde resin; a homopolymer of unsaturated carboxylic acid or a copolymer thereof with another copolymerizable monomer, such as polyacrylic acid, polymethacrylic acid, methacrylic acidstyrene copolymer, methacrylic acid-methyl acrylate copolymer or a styrene-maleic anhydride copolymer; a resin produced by reacting a partial or complete saponification product of polyvinyl acetate with an aldehyde such as acetaldehyde, benzaldehyde, hydroxybenzaldehyde or carboxybenzaldehyde to form partial acetal; and polyhydroxystyrene. Other suitable examples of the binder are organic solvent soluble resins such as cellulose alkyl ethers typified by cellulose methyl ether and cellulose ethyl ether.

The binder is preferably contained in an amount of from about 10 to about 90 wt% based on the total weight of the composition composed of the photosensitive azide compound.

Composition composed of the photosensitive azide compound may optionally contain a dye, pigment, a plasticizer such as phthalate ester, phosphate ester, aliphatic carboxylic acid ester, glycol or sulfonamide, and a sensitizer such as Michler-ketone, 9-fluorenone, 1-nitropyrene, 1,8-dinitropyrene, 2-chloro-1,2-benzanthraquinone, 2-bromo-1,2-benzanthraquinone, pyrene-1,6-quinone, 2-chloro-1,8-phthaloylnaphthalene, or cyanoacridine.

While the basic structure of the PS plate that is suitable for the purpose of this invention is composed of an aluminum substrate overlaid with a photosensitive layer made of the photosensitive materials described above, the photosensitive layer may optionally be coated with one or more resin layers such as specifically described in U.S. Pat. No. 3,136,637 wherein the substrate is overlaid with, in the order written, a photosensitive layer, a lipophilic resin layer, a hydrophobic resin layer, water insoluble resin layer and another layer of resin which is softened by a solvent. A PS plate of similar structure is described in British Pat. Nos. 1,478,333 and 1,478,224 and this structure is also included within the scope of this invention.

The following description illustrates how the plate protective agent of this invention is applied to a PS plate in one preferred embodiment.

First, a PS plate is subjected to imagewise exposure and development to make a lithographic printing plate. The resulting plate is washed with water, the water on the plate is removed with a squeegee, a suitable amount of the protective agent is poured on the plate, and a sponge is used to spread the agent over the entire surface of the plate. As a result of these procedures, the non-image area of the plate is protected in such a manner that the lithographic printing plate can withstand extended storage. The plate is washed with water to remove the gum before beginning the conventional printing procedure. The protective agent of this invention does not decrease the lipophilicity of the image area of a lithographic plate whereas it is capable of enhancing the hydrophilicity of the non-image area.

The protective agent of this invention works most effectively when it is applied to a lithographic printing plate prepared from the PS plate described in either British Pat. Nos. 1,460,978 or 1,505,739.

This invention will hereunder be described in greater detail by reference to the following Examples, wherein all percents are by weight.

EXAMPLES 1 TO 7 AND COMPARATIVE EXAMPLES 1 AND 2

A 0.24 mm thick aluminum substrate was degreased by immersion in a 7% aqueous solution of sodium tertiary phosphate at 60° C., and after water washing, a suspension of pumice in water was poured on the substrate while it was grained by rubbing with a nylon brush. After washing with water, the grained substrate was immersed for a period of 30 to 60 seconds in a 5% aqueous solution of sodium silicate JIS No. 3 (molar ratio of $SiO_2$ to $Na_2O$=3.1 to 3.3) which was controlled at 70° C.

After a thorough washing with water, the substrate was dried and coated with the following sensitive solution A or B. The substrate coated with either sensitive solution was dried at 100° C. for a period of 2 minutes.

| | |
|---|---|
| Sensitive Solution A | |
| A copolymer of 2-hydroxyethyl methacrylate (as synthesized according to the method described in Example 1 of U.S. Pat. No. 4,123,276) | 0.7 g |
| Salt of 2-methoxy-4-hydroxy-5-benzoylbenzenesulfonic acid with a condensate of p-diazodiphenylamine and paraformaldehyde | 0.1 g |
| Oil Blue #603 (C.I. 74350, a product of Orient Chemical Industries Co., Ltd.) | 0.03 g |
| 2-Methoxyethanol | 6 g |
| Methanol | 6 g |
| Ethylene Dichloride | 6 g |
| Sensitive Solution B | |
| Sensitive solution A | 18.83 g |
| A half ester (molecular weight: ca.1500) of styrene/maleic anhydride copolymer (molar ratio of styrene to maleic anhydride = 1.5:1 to 2:1) with 2-methyl-pentanol-4 | 0.014 g |

Each sensitive solution was applied until the dry coating weight was 2.0 g/m². The thus prepared photosensitive lithographic printing plates were designated plates A and B, respectively. Each plate was exposed imagewise for a period of 45 seconds to a carbon arc lamp (30 amperes) placed at a distance of 70 cm. Subsequently, the plate was immersed in a developing solution of the following formulation at room temperature for a period of 1 minute, and the surface of the plate was lightly rubbed with absorbent cotton to remove the unexposed area. The products were labelled lithographic printing plates A and B.

| Developing Solution | |
|---|---|
| Sodium Sulfite | 3 g |
| Benzyl Alcohol | 30 g |
| Triethanolamine | 20 g |
| Monoethanolamine | 5 g |
| Perex NBL (sodium tert-butylnaphthalene-sulfonate manufactured by Kao-Atlas Co., Ltd.) | 30 g |
| Water | 1000 ml |

An aqueous solution C of the following formulation was prepared, a solution D of another formulation set forth below was gradually added to the aqueous solution C under vigorous stirring, and the resulting emulsion was subjected to further emulsification using a homogenizer until the protective agent of this invention was produced.

| | |
|---|---|
| Aqueous Solution C | |
| Gum Arabic | 4 g |
| Dextrin | 16 g |
| Phosphoric Acid (85%) | 0.2 g |
| Water | 75 g |
| Solution D | |
| Sodium Dilauryl Sulfosuccinate | 1.0 g |
| Dibutyl Phthalate | 2.0 g |
| Alkylphenyl Type Nonionic Surfactant (shown in Table 1) | 1.0 g |
| Rosin Ester (a product of Arakawa | 0.5 g |

-continued

| |
|---|
| Chemical Co., Ltd.) |

The previously prepared lithographic printing plate was washed with water, excess water was removed by a squeegee, a small amount of the protective agent was poured dropwise and a sponge was used to spread the agent so as to cover the entire surface of the printing plate. Subsequently, the plate was washed with water to remove the protective agent from its surface and set on a printing machine for printing the lipophilicity of the plate was evaluated by counting the number of sheets spent before printed matter having satisfactory density of printing ink was obtained (this number will hereunder be referred to as the number of wasted sheets). The results of evaluation are indicated in Table 1 below.

TABLE 1

| | | | No. of Wasted Sheets | |
|---|---|---|---|---|
| Run No. | Alkylphenyl Type Nonionic Surfactant | HLB | Printing Plate A | Printing Plate B |
| Ex.1 | Polyoxyethylene nonylphenyl ether | 8 | 10 | 10 |
| Ex.2 | Polyoxyethylene nonylphenyl ether | 10 | 10 | 5 |
| Ex.3 | Polyoxyethylene nonylphenyl ether | 12 | 10 | 5 |
| Ex.4 | Polyoxyethylene nonylphenyl ether | 14 | 10 | 5 |
| Com.Ex.1 | Polyoxyethylene nonylphenyl ether | 18 | 40 | 35 |
| Ex.5 | Polyoxyethylene dodecylphenyl ether | 8 | 10 | 10 |
| Ex.6 | Polyoxyethylene dodecylphenyl ether | 10 | 10 | 5 |
| Ex.7 | Polyoxyethylene dodecylphenyl ether | 14 | 10 | 10 |
| Com.Ex.2 | Solution C only | — | 60 | 60 |

Table 1 indicates the high lipophilicity of the protective agent prepared according to this invention. It is to be noted that all the lithographic printing plates treated with the protective agents of Examples 1 to 7 and Comparative Examples 1 and 2 provided printed matter without stain.

EXAMPLE 8

A mechanically grained 2S aluminum substrate was partially etched by immersion in a 2% aqueous solution of sodium hydroxide at 40° C. for a period of 1 minute. After washing with water, the aluminum substrate was immersed in a mixture of sulfuric acid and chromic acid for a period of about 1 minute to expose the surface of pure aluminum. The substrate was then immersed in 20% sulfuric acid at 30° C., and subjected to anodization at a D.C. voltage of 1.5 V and a current density of 3 A/dm$^2$, followed by washing with water and drying. Subsequently, a roll coater was used to coat continuously the substrate with a sensitive solution of the following formulation until the dry coating weight was 2 g/m$^2$.

| Sensitive Solution | |
|---|---|
| Naphthoquinone-1,2-diazide(2)-5-sulfonic acid ester of acetone-pyrrogallol resin (synthesized according to the method described in Example 1 of U.S. Pat. No. 3,635,709) | 5 g |
| PR-50530 (tertiary-butylphenol/formaldehyde resin manufactured by Sumitomo Durez Co., Ltd.) | 0.5 g |
| Hitanol #3110 (cresol/formaldehyde resin manufactured by Hitachi Chemical Co., Ltd.) | 5 g |
| Methyl Ethyl Ketone | 50 g |
| Cyclohexanone | 40 g |

The plate was dried at 100° C. for a period of 2 minutes and had the performance of a PS plate which could be stored in a cool dark place for a period of 1 year without any significant deterioration in its quality. The thus presensitized lithographic printing plate was set in a vacuum printing frame and exposed to a Fuji Film PS Light (having the 3 KW light source of Toshiba Metal Halide Lamp MU 2000-2-OL and sold by Fuji Photo Film Co., Ltd.) through a positive film for a period of 30 seconds. Subsequently, the plate was immersed in a developing solution of the following formulation.

| Developing Solution | |
|---|---|
| Sodium Silicate JIS No. 3 | 10 g |
| Aerosol OS (sodium isopropylnaphthalenesulfonate manufactured by American Cyanamide Co.) | 20 g |
| Benzyl alcohol | 30 g |
| Water added to make 1000 ml | |

The resultant lithographic printing plate was washed with water, squeegeed, gummed with one of the three protective agents indicated in Table 2 below, and dried at 80° C. for a period of 5 minutes. The three printing plates were allowed to stand at a temperature of 20° C. for a period of 7 days, washed with water to remove the protective agent from their surface, used to print in a conventional procedure, and the number of wasted sheets was counted and any stained non-image area of the printed matter was checked. The results of evaluation are shown in Table 2.

TABLE 2

| Protective Agent | Com. Ex. 1 | Ex. 2 | Com. Ex. 2 |
|---|---|---|---|
| No. of wasted sheets | 15 | 5 | 15 |
| Stain | None | None | None |

The above results show that the protective agent of this invention does not decrease the lipophilicity of the image area of the printing plate nor does it produce any stain on the non-image area.

EXAMPLE 9

The procedure of Example 3 was repeated except that dibutyl phthalate used as the organic solvent for the protective agent was replaced by K-solvent. Both printing plates A and B provided the same result as Example 3.

EXAMPLES 10 TO 16 AND COMPARATIVE EXAMPLES 3 AND 4

The procedure of Example 1 was repeated except that the printing plate was coated with a protective agent prepared by emulsifying a mixture of an aqueous solution E and a solution F of the following formulations. The results of evaluation of the lipophilicity of the image area of each printing plate are indicated in Table 3 below.

| | |
|---|---|
| Aqueous Solution E | |
| Gum Arabic | 4 g |
| Dextrin | 16 g |
| Phosphoric Acid (85%) | 0.2 g |
| Water | 75 g |
| Solution F | |
| Sodium di(2-ethylhexyl)sulfosuccinate | 1.0 g |
| Dioctyl phthalate | 2.0 g |
| Alkylphenyl type nonionic surfactant (see Table 3 below) | |
| Rosin ester (a product of Arakawa Chemical Co., Ltd.) | 0.5 g |

Table 3 shows that the protective agent of this invention has the property of not reducing the lipophilicity of the image area of a lithographic printing plate.

TABLE 3

| Run No. | Alkylphenyl Type Nonionic Surfactant | HLB | No. of Wasted Sheets Printing Plate A | Printing Plate B |
|---|---|---|---|---|
| Example 10 | polyoxyethylene nonylphenyl ether | 8 | 10 | 10 |
| Example 11 | polyoxyethylene nonylphenyl ether | 10 | 10 | 10 |
| Example 12 | polyoxyethylene nonylphenyl ether | 12 | 10 | 5 |
| Example 13 | polyoxyethylene nonylphenyl ether | 14 | 10 | 5 |
| Comp.Ex. 3 | polyoxyethylene nonylphenyl ether | 18 | 40 | 50 |
| Example 14 | polyoxyethylene dodecylphenyl ether | 8 | 10 | 10 |
| Example 15 | polyoxyethylene dodecylphenyl ether | 10 | 10 | 5 |
| Example 16 | polyoxyethylene dodecylphenyl ether | 14 | 10 | 10 |
| Comp.Ex. 4 | Protective agent consisted of only Solution E | | 60 | 60 |

While the invention has been described in detail and with reference to specific embodiments thereof, it will be apparent to one skilled in the art that various changes and modifications can be made therein without departing from the spirit and scope thereof.

What is claimed is:

1. A process for gumming a lithiographic printing plate having a hydrophilic non-image area and a lipophilic image area which comprises the steps of:

(a) preparing a protective agent comprising an aqueous phase having dissolved therein a film-forming hydrophilic high molecular weight compound for protecting the non-image area and an oil phase containing a water-insoluble organic solvent and a surfactant, wherein said surfactant is comprised of an alkylphenyl type nonionic surfactant represented by the general formula (I)

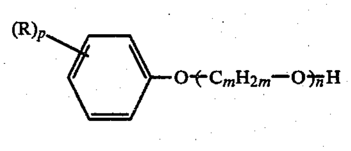

(I)

where R is an alkyl group, p is 1 or 2, m is an integer of 1 to 4 and n is an integer of 2 or more, the surfactant having an HLB less than 14 and a sodium salt of a dialkylsulfosuccinate; and (b) coating a plate with said emulsion-type protective agent.

2. The process of claim 1, wherein said alkylphenyl nonionic surfactant is selected from the group consisting of a polyoxymethylene octylphenyl ether, a polyoxymethylene nonylphenyl ether, a polyoxymethylene cetylphenyl ether, a polyoxymethylene laurylphenyl ether, a polyoxyethylene octylphenyl ether, a polyoxymethylene nonylphenyl ether, a polyoxyethylene decylphenyl ether, a polyoxyethylene laurylphenyl ether, a polyoxypropylene octylphenyl ether, a polyoxypropylene nonylphenyl ether, a polyoxypropylene decylphenyl ether, a polyoxypropylene laurylphenyl ether, a polyoxypropylene cetylphenyl ether, a polyoxybutylene octylphenyl ether, a polyoxybutylene nonylphenyl ether, a polyoxybutylene decylphenyl ether, a polyoxybutylene laurylphenyl ether, a polyoxybutylene cetylphenyl ether, and a polyoxyethylene dinonylphenyl ether all having an HLB less than 14.

3. The process of claim 1, wherein said alkylphenyl nonionic surfactant is polyoxyethylene nonylphenyl ether or polyoxyethylene octylphenyl ether.

4. The process of claim 1, wherein said dialkylsulfosuccinate is selected from the group consisting of sodium dihexylsulfosuccinate, sodium di(2-ethylhexyl)-sulfosuccinate, sodium dinonylsulfosuccinate and sodium dilaurylsulfosuccinate.

5. The process of claim 1, wherein the total amount of said nonionic and said anionic surfactant is about 0.5 to about 10 weight % based on the weight of the plate protective agent.

6. The process of claim 1, wherein the proportion of said nonionic surfactant to said anionic surfactant is about 10:1 to 1:10.

7. The process of claim 1, wherein said organic solvent is a plasticizer which solidifies at a temperature less than 15° C. and boils at a temperature higher than 300° C. at atmospheric pressure.

8. The process of claim 1, wherein said organic solvent is a solvent insoluble in water.

9. The process of claim 1, wherein said solvent is present in an amount of about 0.1 to 10 weight % based on the weight of the surface protective agent.

10. The process of claim 1, wherein said oil phase additionally contains a lipophilic substance which enhances the stability of the emulsion.

11. The process of claim 1, wherein said hydrophilic compound is selected from the group consisting of dextrin, gum arabic, an alginate, a water soluble cellulose, polyvinyl alcohol, polyvinyl pyrrolidone, polyacrylamide, an acrylamide copolymer, vinylmethyl ether-maleic anhydride copolymer, and vinyl acetate-maleic anhydride copolymer.

12. The process of claim 11, wherein said hydrophilic compound is selected from the group consisting of gum arabic, dextrin, polyvinyl pyrrolidone, carboxymethyl cellulose and polyvinyl alcohol.

13. The process of claim 12, wherein said hydrophilic polymer is gum arabic.

14. The process of claim 1, wherein said hydrophilic high molecular weight compound is present in an amount of about 5 to 40 weight % based on the weight of the surface protective agent.

15. The process of claim 1, wherein said aqueous phase additionally contains a wetting agent.

16. The process of claim 1, wherein said wetting agent is a polyhydric alcohol.

17. The process of claim 1, wherein said aqueous phase additionally contains a water soluble salt.

18. The process of claim 1, wherein said alkylphenyl nonionic surfactant has an HLB in the range of from 4 to 12.

19. The process of claim 18, wherein said alkylphenyl nonionic surfactant has an HLB in the range of from 7 to 12.

20. The process of claim 19, wherein the total amount of said nonionic and said anionic surfactant is about 0.5 to about 10 weight % based on the weight of the plate protecting agent.

21. The process of claim 20, wherein the proportion of said nonionic surfactant to said anionic surfactant is about 10:1 to 1:10.

22. The process of claim 21, wherein said proportion is 5:1 to 1:5.

23. The process of claim 22, wherein said water-insoluble organic solvent is a plasticizer which solidifies at a temperature less than 15° C. and boils at a temperature higher than 300° C. at atmospheric pressure.

24. The process of claim 23, wherein said plasticizer is present in an amount of about 0.1 to 10 weight % based on the weight of the surface protective agent.

25. The process of claim 24, wherein said oil phase additionally contains a lipophilic substance which enhances the stability of the emulsion and minimizes the potential decrease in the lipophilicity of said image area.

26. The process of claim 25, wherein said lipophilic substance is selected from the group consisting of a novolac phenolic resin, rosin and modified rosin.

27. The process of claim 25, wherein said lipophilic substance is an aliphatic carboxylic acid having 5 to 25 carbon atoms or castor oil.

28. The process of claim 27, wherein said aliphatic carboxylic acid is oleic acid, lauric acid, valeric acid, nonylic acid, capric acid, myristic acid or palmitric acid.

29. The process of claim 25, wherein said lipophilic substance is present in an amount from about 0.05 to about 5 weight % based on the total weight of the protective agent.

30. The process of claim 29, wherein said lipophilic substance is present in an amount from 0.1 to 1 weight % based on the total weight of the protective agent.

31. The process of claim 25, wherein said film forming hydrophilic high molecular weight compound is selected from the group consisting of gum arabic, dextrin, polyvinyl pyrrolidone, carboxymethyl cellulose and polyvinyl alcohol.

32. The process of claim 31, wherein said film forming hydrophilic high molecular weight compound is gum arabic.

33. The process of claim 31, wherein said film forming hydrophilic high molecular weight compound is a combination of gum arabic and dextrin.

34. The process of claim 31, wherein said film forming hydrophilic high molecular weight compound is present in an amount from about 5 to 40 weight % based on the total weight of the protective agent, and in an amount from about 6 to about 60 weight % in the aqueous phase.

35. The process of claim 31, wherein said aqueous phase additionally contains a polyhydric alcohol which is selected from the group consisting of ethylene glycol, diethylene glycol, triethylene glycol, propylene glycol, butylene glycol, pentane diol, hexylene glycol, tetraethylene glycol, polyethylene glycol, dipropylene glycol, tripropylene glycol, glycerin, sorbitol and pentaerythritol.

36. The process of claim 35, wherein said polyhydric alcohol is glycerin.

37. The process of claim 35, wherein said polyhydric alcohol is present in an amount from about 0.5 to about 10 weight % based on the total weight of the protective agent.

38. The process of claim 32, wherein said aqueous phase has a pH from 1 to 5.

39. The process of claim 38, wherein said aqueous phase has a pH from 1 to 3.

40. The process of claim 39, wherein said aqueous phase contains phosphoric acid.

41. The process of claim 40, wherein said phosphoric acid is present in an amount of from 0.1 to 8 weight % based on the total weight of said aqueous phase.

42. The process of claim 41, wherein said phosphoric acid is present in an amount of from 0.5 to 5 weight % based on the total weight of said aqueous phase.

43. The process of claim 42, wherein said aqueous phase additionally contains a water soluble salt selected from the group consisting of water-soluble alkali metal salts and ammonium salts of acetic acid, molybdic acid, boric acid, nitric acid, sulfuric acid, phosphoric acid and polyphosphoric acid.

44. A process for preparing a printing plate which comprises exposing and developing a printing plate forming material and coating the plate with an emulsion type protective agent comprising an aqueous phase having dissolved therein a film-forming hydrophilic high molecular weight compound for protecting the non-image area and an oil phase containing a water-insoluble organic solvent and a surfactant represented by the general formula (I):

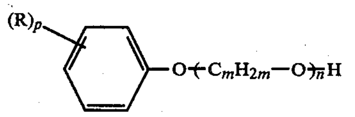

(I)

where R is an alkyl group, p is 1 or 2, m is an integer of 1 to 4 and n is an integer of 2 or more, the surfactant having an HLB less than 14 and a sodium salt of a dialkylsulfosuccinate surfactant.

* * * * *